United States Patent
Mukuno et al.

(10) Patent No.: US 6,541,364 B2
(45) Date of Patent: Apr. 1, 2003

(54) BUMP FORMING METHOD AND BUMP FORMING APPARATUS

(75) Inventors: Hideki Mukuno, Hitachiota (JP); Jun Matsui, Mito (JP); Kaoru Uchiyama, Omiya (JP); Takayuki Itsuji, Hitachinaka (JP); Kunio Kondo, Kawasaki (JP)

(73) Assignees: Hitachi, Ltd., Tokyo (JP); Hitachi Car Engineering Co., Ltd., Hitachinaka (JP)

(*) Notice: Subject to any disclaimer, the term of this patent is extended or adjusted under 35 U.S.C. 154(b) by 0 days.

(21) Appl. No.: 09/986,768

(22) Filed: Nov. 9, 2001

(65) Prior Publication Data

US 2002/0058406 A1 May 16, 2002

(30) Foreign Application Priority Data

Nov. 10, 2000 (JP) ........................................ 2000-342819

(51) Int. Cl.[7] .............................................. H01L 21/44
(52) U.S. Cl. ................. 438/612; 438/613; 228/180.21; 228/180.22
(58) Field of Search ................................ 438/612, 613; 228/180.21, 180.22

(56) References Cited

U.S. PATENT DOCUMENTS

| 4,871,110 A | * 10/1989 | Fukasawa et al. | 228/245 |
| 5,685,477 A | * 11/1997 | Mallik et al. | 228/254 |
| 6,063,701 A | * 5/2000 | Kuwazaki et al. | 438/616 |
| 6,191,022 B1 | * 2/2001 | Creswick | 438/612 |
| 6,268,275 B1 | * 7/2001 | Cobbley et al. | 438/612 |

FOREIGN PATENT DOCUMENTS

| JP | 6-291122 | 10/1994 |
| JP | 7-202403 | 8/1995 |
| JP | 7-254777 | 10/1995 |
| JP | 9-46704 | 2/1997 |
| JP | 9-107045 | 4/1997 |
| JP | 9-134923 | 5/1997 |
| JP | 2663927 | 6/1997 |
| JP | 2713263 | 10/1997 |
| JP | 11-135565 | 5/1999 |
| JP | 2000-133923 | 5/2000 |

* cited by examiner

*Primary Examiner*—Albert W. Paladini
*Assistant Examiner*—David A. Zarneke
(74) *Attorney, Agent, or Firm*—Crowell & Moring LLP (57) ABSTRACT

A mask 11 has a plurality of holes formed at positions corresponding to positions of a plurality of electrode portions 10a on one surface of an object to be processed 10 to mount thereon conductive particles 13, and the plurality of holes are opposite to the plurality of electrode portions 10a formed on the object to be processed. A table 12 has a plurality of holes 12a for sucking the object to be processed 10 from the other surface of the object to be processed 10, and for sucking the particles 13 through the plurality of holes 11a in the mask 11 so that the particles 13 may be mounted on the electrode portions 10a formed on the object to be processed 10. A hopper 14 contains therein the plurality of conductive particles 13, prevents the plurality of conductive particles 13 from adhering to each other, and has a slit portion 17 for dropping the plurality of conductive particles 13 by the self-weight. A slit portion 17 in the hopper 14 is moved, facing the upper surface of the mask 11 with a gap between the slit portion 17 and the upper surface of the mask 11 larger than a diameter of the particle 13, and the hopper 14 is arranged in the front side in the moving direction, and the unit 15 is arranged in the rear side, and the particles 13 not dropped into the holes of the mask being collected by the collecting unit 15.

9 Claims, 8 Drawing Sheets

BUMP FORMING METHOD AND BUMP FORMING APPARATUS

BACKGROUND OF THE INVENTION

1. Technical Field of the Invention

The present invention relates to a bump forming method of and bump forming apparatus for forming bumps on electrode portions, which are to be formed as so-called semiconductor device terminals, of a semiconductor wafer, a board having an electronic circuit formed thereon, or the like, using conductive particles.

2. Description of Prior Arts

There have been many kinds of bump forming methods and bump forming apparatuses. For example, there are a plating method in which metal is deposited on electrode portions of a semiconductor device through plating to form bumps, a printing method in which solder paste is printed on electrode portions of a semiconductor device and then heated to melt the solder in the solder paste to form bumps, and a stud bump method in which an end of a metallic wire is connected to an electrode portion of a semiconductor device and then the connected wire is cut off to form bumps.

Further, there is a solder ball mounting method in which solder balls (conductive particles) are sucked into a jig by vacuum suction to apply flux onto bottom surfaces of the solder balls, and the solder balls are mounted onto electrode portions of a wafer or a circuit board, and then the solder balls are heated and melted to form bumps.

As electronic products are being downsized and grown more powerful, the bump pitch and the bump diameter are rapidly being decreased as an IC package is changed from a QFP (quad flat package) to a BGA (ball grid array) and further from a CSP (chip size package) to a flip chip.

As the IC is being downsized, the conventional plating method is difficult to form bumps having a sufficient volume and further has a problem that the plating time requires a long time.

On the other hand, the conventional printing method has a problem that when the bumps of an IC are connected to a circuit board or the like, it is difficult to connect all of the bumps correctly because deviations occur in the bump volume and the bump height.

Further, the conventional stud bump method has a problem that the electrically conductive material of the circuit board used for being connected to the bumps is limited because the material of the bumps is gold.

Further, the conventional solder ball mounting method has the problems that number of balls capable of mounting at a time is only several hundreds and that the ball can not be mounted unless the diameter of the ball is above 300 $\mu$m though the bumps can be formed without deviations in the bump volume and the bump height.

In addition to the above problems, there is a problem that since time required for mounting the solder ball is approximately 15 seconds/mounting, it takes more than several hours to mount several tens thousands solder balls and accordingly the productivity is low.

In more detail, there are the following technologies A to I known in the art which are described below. As disclosed in Japanese Patent Application Laid-Open No. 9-46704, a bump forming method of known technology (Example A) comprises a flux applying process of partially applying flux only surfaces of pads on a circuit board to form the bumps thereon; a solder ball adhering process of flux-adhering solder balls onto the surfaces of the solder pads through a mask having through holes capable of letting the solder balls pass through, the through hole being opposite to the solder pad; and a heating process of heating at a solder melting temperature after removing the mask to forming the solder bump.

In the bump forming method of Example A, many solder balls remaining in the regions other than the through holes of the mask are dropped down by turning over the circuit board and the mask together.

As disclosed in Patent Publication No. 2663927, a bump forming method of known technology (Example B) comprises a solder paste printing process of partially printing solder paste only onto surfaces of solder pads on a circuit board to form solder bumps thereon; and a solder ball pressing process of rutting solder balls into through holes of a mask opposite to the solder pads and capable of letting the solder balls pass through and pressing the solder balls from the upper side using projections each having a diameter smaller than the diameter of the solder ball.

As disclosed in Japanese Patent Application Laid-Open No. 6-291122, a bump forming method of known technology (Example C) is that perforations with bottom are bored in a mask, and solder balls are put into these perforations, and then excess solder balls are discharged through a solder ball discharging port by moving a brush along the upper surface of the mask.

As disclosed in Japanese Patent Application Laid-Open No. 7-254777, a bump forming method of known technology (Example D) is that a solder pad forming solder bumps on a chip part and a mask having through holes capable of letting solder balls pass through are positioned, and then the solder balls supplied to a box-shaped side wall are moved so as to be dropped into the through holes of the mask.

As disclosed in Japanese Patent Application Laid-Open No. 7-202403, a bump forming method of known technology (Example E) is that a solder pad forming solder bumps on a chip part and a mask having through holes capable of letting solder balls pass through are positioned, and then the solder balls supplied to a ball hopper are moved so as to be dropped into the through holes of the mask.

As disclosed in Japanese Patent Application Laid-Open No. 9-107045, a bump forming method of known technology (Example F) is that solder paste is partially applied onto only the 26 surfaces of solder pads on a BGA package to form solder bumps thereon, and a mask having through holes capable of letting solder balls pass through is positioned, and then a squeegee is moved to put the solder balls into the through holes of the mask.

As disclosed in Japanese Patent Application Laid-Open No. 11-135565, a bump forming method of known technology (Example G) is that flux is partially applied onto only the surfaces of bump pads on a board to forming solder bumps thereon, and a mask having through holes capable of letting solder balls pass through is positioned, and then the solder balls are heated after pressing the solder balls using a solder ball pushing plate.

As disclosed in Patent Publication No. 2713263, a bump forming method of known technology (Example H) is that cream solder is partially applied onto only the surfaces of pads on a print board to form solder bumps thereon, and a nozzle portion having a through hole capable of letting solder ball pass through is positioned, and then the solder ball is heated after pressing the solder ball in the nozzle portion onto the print board.

As disclosed in Patent Publication No. 2891085, a bump forming method of known technology (Example I) comprises a flux applying process of partially applying flux only surfaces of solder ball electrodes on a semiconductor element to form bumps thereon; a process of adhering solder balls onto the surfaces of the solder ball electrodes through a mask having through holes capable of letting the solder balls pass through, the through hole being opposite to the solder pad; and a process of dropping down many solder balls remaining in the regions other than the through holes of the mask by slightly tilting the semiconductor element and the mask together.

Further, there is a known technology titled "Solder Ball Supply Apparatus" disclosed in Japanese Patent Application Laid-Open No. 9-134923 which is similar to Example A.

In addition to the known technologies of Examples A to I, there is another known technology titled "Method of Mounting Conductive Balls on a Substrate" disclosed in Patent Application Laid-Open No. 2000-133923.

The "method of mounting conductive balls on a substrate" disclosed in Patent Application Laid-Open No. 2000-133923 is that a flat-plate shaped positioning means having many conductive ball receiving holes is arranged on a downward tilt, and a plurality of conductive balls are supplied to the positioning means from a ball storing hopper to be put into the ball receiving holes.

The conductive balls not entered into the ball receiving holes are received into a conductive ball collecting hopper.

The positioning means receiving the many conductive balls is rotated so as to be in a horizontal position, and the conductive balls on the positioning means are attracted by a conductive ball attracting means.

After that, the conductive ball attracting means attracting the conductive balls is mounted on an electrically non-conductive member supply portion.

SUMMARY OF THE INVENTION

However, the conventional bump forming methods of (Example A) to (Example I) described above have problems as follows.

The first problem of the structure in the conventional bump forming methods is that the conductive particles adhere to each other.

This is a phenomenon that often occurs in particles having a diameter smaller than 300 $\mu$m, and is caused by the van der Waals attraction due to charging of the conductive particles or unevenness of electron density of the conductive particles.

For example, when the conductive particles are dropped into the through holes of the mask while being slid the supply unit or on the mask using the brush, the squeegee or the like, static electricity is generated by contact between the conductive particles to each other and between the conductive particle and the mask, the supply unit, the brush, the squeegee or the like.

Since the conductive particles adhere onto the surface portion of the mask or the inside of the through holes of the mask, and the supply unit or the brush, the squeegee or the like by the static electricity, movement of the conductive particles can not be controlled, and accordingly the conductive particles can not be certainly supplied into the through holes of the mask by the self-weight.

Further, since the conductive particles adhere to halfway positions, in incomplete states, of the though holes of the mask due to the influence of the static electricity, there occurs a phenomenon that the conductive particles are seized in the tip end portion of the supply unit or the end surface portion of the squeegee to cause damage of the conductive particles.

The second problem of the structure in the conventional bump forming methods is that the conductive particles are apt to be deformed by external forces acting on the conductive particles because the conductive particles are slid on the mask using the squeegee or the brush, and accordingly the conductive particles can not be certainly inserted into or supplied to the though holes of the mask by the self-weight when the conductive particles are deformed by an amount above a diameter of the through holes of the mask.

The third problem of the structure in the conventional bump forming methods is that when the mask is removed from the wafer or the circuit board after putting the many conductive particles into the through holes of the mask, the conductive particles mounted on the electrode portions on the circuit board are apt to drop down due to friction between the inner surface of the though hole of the mask and the conductive particle.

Here, describing on the known technology of Example A described above, since the solder balls are dropped into the through holes of the mask only using the self-weight of the solder ball, there is a problem that the solder balls are charged and the many solder balls stay and remain at positions other than the through holes of the mask. However, the influence of the static electricity is not taken into consideration.

In addition to this, there is a problem in that the solder balls introduced into the through holes of the mask are apt to be dropped down by vibration of the mask produced when the circuit board and the mask are turned over. However, this influence of the vibration is not taken into consideration.

Further, the known technology of Example B does not take into consideration how to put the solder balls into the through holes of the mask. Furthermore, there is no consideration on the influence of the static electricity which is produced by the friction between the solder ball and the through hole of the mask when the solder balls are pushed out onto the upper portions of the circuit board by pushing out the positioned projections.

Further, since such a structure is taken that the solder balls put in the perforations of the mask are dropped to the convex solder pad forming the solder bump on the circuit board, the solder balls are dropped into the through holes of the mask by the self-weight due to charge of the solder balls when the mask and the circuit board are turned over.

Further, the conductive particles are apt to be deformed by external forces acting on the conductive particles because the structure is that the solder balls of the conductive particles are slid on the mask using the brush, and accordingly the conductive particles can not drop into the through holes of the mask by the self-weight when the conductive particles are deformed by an amount above a diameter of the through holes of the mask.

The structure of the known technology of Example D is that since the mask and the surfaces of the solder balls and the box-shaped inner wall are charged by movement of the solder balls supplied to a box-shaped side wall, the solder balls put in the through holes are apt to spring out from the perforations of the mask.

Further, since the solder balls adhere to halfway positions of the though holes of the mask, there occurs the phenomenon that the solder balls are apt to be chipped by being seized in the corner portion of the box-shaped storing frame.

Further, the conductive particles are apt to be deformed by external forces acting on the conductive particles because the structure is that the conductive particles are slid on the mask using the box-shaped storing frame, and accordingly the conductive particles are difficult to be dropped into the through holes of the mask by the self-weight when the conductive particles are deformed by an amount above a diameter of the through holes of the mask.

Further, the structure of the known technology of Example E is that since the mask and the surfaces of the solder balls and the inner wall of the ball hopper are easily charged by moving of the solder balls supplied to the box-shaped ball hopper, the solder balls put in the through holes of the mask are apt to spring out from the perforations of the mask.

Further, since the solder balls adhere to halfway positions of the through holes of the mask by the static electricity, there occurs the phenomenon that the solder balls are apt to be chipped by being seized in the end portion of the ball hopper or the pressing member.

Further, the conductive particles of the conductive particles are apt to be deformed by external forces acting on the solder balls because the structure is that the conductive particles are slid on the mask using the ball hopper, and accordingly the conductive particles are difficult to be dropped into the through holes of the mask by the self-weight when the conductive particles are deformed by an amount above a diameter of the through holes of the mask.

Further, the structure of the known technology of Example F is that since the mask and the surfaces of the solder balls and the squeegee are easily charged by moving of the solder balls supplied to the sword-tip-shaped squeegee, the solder balls once put in the through holes of the mask are apt to spring out from the perforations of the mask.

Further, since the solder balls adhere to halfway positions of the through holes of the mask by the static electricity, there occurs the phenomenon that the solder balls are apt to be chipped by being caught by the squeegee.

Further, the conductive particles are apt to be deformed by external forces acting on the conductive particles because the structure is that the conductive particles are slid on the mask using the sword-tip-shaped squeegee, and accordingly the conductive particles are difficult to be dropped into the through holes of the mask by the self-weight when the conductive particles are deformed by an amount above a diameter of the through holes of the mask.

The known technology of Example G does not consider how to put the solder balls into the through holes of the mask.

Further, the structure of the known technology of Example H is that the metallic balls are apt to be caught by the corner of the through holes of the nozzle portions when the pressing portions are inserted into the through holes of the pressing portions. Further, the structure is that the metallic balls are apt to be deformed by external forces acting on the metallic balls.

Further, the structure of the known technology of Example I is that since the solder balls are put into the through holes of the mask while the solder balls are being slid from the upper portion of the mask to the down portion in a state that the semiconductor element and the mask are slightly tilted, the solder balls are charged by friction between the solder balls and the mask and accordingly the solder balls are apt to remain on the mask.

Further, the structure is that the solder balls once entering the through holes are apt to spring out due to the charge of the balls.

For example, in a case where the conductive particle is made of a solder having tin, lead or silver as the main component, and the diameter is smaller than 300 $\mu$m, static electricity of ±50 to ±3000 V is generated between the mask and the solder balls when the solder balls are slid on the mask.

The conventional technologies described above have not been practically used because the structure is that the conductive particles are difficult to be dropped into the through holes of the mask due to the influence of the static electricity and the van der Waar force produced on the surfaces of the conductive particles, and because the problem of producing the damage such as forming chips in the conductive particles can not solved due to the structure that the conductive particles are apt to be caught by the tip end portion of the supply unit such as the hopper or the like.

An object of the present invention is to provide an economical bump forming method and an economical bump forming apparatus by which bumps can be formed on electrode portions of a wafer or a circuit board (or substrate) using spherical conductive particles having a given dimensional accuracy in order to make the deviations of bump height and volume of conductive particles having a diameter smaller than 300 $\mu$m.

Further, another object of the present invention is to provide a bump forming method and a bump forming apparatus recyclable of the conductive particles by certainly and easily sucking and collecting the excess conductive particles remaining on the mask to reuse the expensive conductive articles.

In order to attain the above objects, the present invention is constructed as follows.

(1) A bump forming method which forms bumps on electrode portions of a semiconductor wafer or an electronic circuit board using conductive particles, the method comprising a process of positioning a mask having through holes for the conductive particles at bump forming positions to the wafer or the circuit board, and putting the mask and the wafer or the circuit board on a table having suction holes formed thereon; a particle mounting process of moving a conductive particle supply means while the conductive particles are being dropped on the mask, and sucking the conductive particles through the holes formed on the table via the through holes formed in the mask in synchronism with a moving position of the conductive particle supply means, and mounting the conductive particles onto the electrode portions of the semiconductor wafer or the electronic circuit board; and a ball collecting process of collecting the conductive particles not dropped into the through holes of the mask.

(2) In the bump forming method according to the above item (1), it is preferable that a groove for sucking the conductive particles is formed in a tip end portion of the conductive particle supply means, and the conductive particle supply means controls holding and dropping of the conductive particle by controlling sucking and not-sucking of the conductive particle using the sucking groove.

(3) In the bump forming method according to any one of the above item (1) and the above item (2), it is preferable that a charge neutralizing fluid is blown to the conductive particles contained in the supply means.

(4) In the bump forming method according to any one of the above items (1), (2) and (3), it is preferable that a vibrator is arranged on a side surface of a conductive particle containing portion of the supply means, and the conductive particles are dropped down from the supply means while vibration is being added to the conductive particles.

(5) In the bump forming method according to any one of the above items (1), (2), (3) and (4), it is preferable that flux or solder paste or conductive adhesive is attached onto the electrode portions on the semiconductor wafer or the circuit board in advance, and then heat is supplied from an upper side of the thorough holes of the mask after dropping the conductive particles to increase a sticking force between the electrode portion and the conductive particle.

(6) In the bump forming method according to any one of the above items (1), (2), (3), (4) and (5), it is preferable that the conductive particles not dropped into the through holes of the mask are collected by a particle collecting means, the particle collecting means comprises an suction portion for sucking the conductive particles, and many slit grooves are formed in an inlet port of the suction portion to collect the conductive particles by producing a turbulent flow in the suction portion.

(7) In the bump forming method according to any one of the above items (1), (2), (3), (4), (5) and (6), it is preferable that a surface material of the table has a film made of any material of iron, zirconia, alumina or zirconia or chromium, and titanium.

(8) In the bump forming method according to the above item (5), it is preferable that a material boiling temperature of the flux, the solder paste or the conductive adhesive is higher than a melting point of the conductive particle by +10° C. to +40° C.

(9) In the bump forming method according to any one of the above items (1), (2), (3), (4), (5), (6), (7) and (8), it is preferable that the conductive particles are collected, subjecting the collected conductive particles to separation of the conductive particles and dust using a centrifuge in a centrifugal chamber.

(10) A bump forming apparatus for forming bumps on electrode portions of a semiconductor wafer or an electronic circuit board using conductive particles, which comprises a mask having through holes for the conductive particles at positions to form the bumps thereon; a table having a plurality of suction holes, the wafer or the circuit board being placed on the table, the conductive particles being sucked through the suction holes via the through holes formed in the mask; a conductive particle supply means moving while dropping the plurality of conductive particles into the through holes of the mask; and a conductive particle collecting means for collecting the conductive particles, wherein the conductive particles are sucked through the holes formed in the table via the through holes formed in the mask in synchronism with positions to be mounted onto electrode portions on the semiconductor wafer or the electronic circuit board, and the conductive particles not dropped into the through holes of the mask are collected by the conductive particle collecting means.

(11) In the bump forming apparatus according to the above item (10), it is preferable that a groove for sucking the conductive particles is formed in a tip end portion of the conductive particle supply means, and the conductive particle supply means controls holding and dropping of the conductive particle by controlling sucking and not-sucking of the conductive particle using the sucking groove.

(12) In the bump forming apparatus according to any one of the above item (10) and the above item (11), it is preferable that a charge neutralizing fluid is blown to the conductive particles contained in the supply means.

(13) In the bump forming apparatus according to any one of the above items (10), (11) and (12), it is preferable that a vibrator is arranged on a side surface of a conductive particle containing portion of the supply means, and the conductive particles are dropped down from the supply means while vibration is being added to the conductive particles.

(14) In the bump forming apparatus according to any one of the above items (10), (11), (12) and (13), it is preferable that flux or solder paste or conductive adhesive is attached onto the electrode portions on the semiconductor wafer or the circuit board in advance, and then heat is supplied from an upper side of the thorough holes of the mask after dropping the conductive particles to increase a sticking force between the electrode portion and the conductive particle.

(15) In the bump forming apparatus according to any one of the above items (10), (11), (12), (13) and (14), it is preferable that the conductive particles not dropped into the through holes of the mask are collected by a particle collecting means, the particle collecting means comprises an suction portion for sucking the conductive particles, and many slit grooves are formed in an inlet port of the suction portion to collect the conductive particles by producing a turbulent flow in the suction portion.

(16) In the bump forming apparatus according to any one of the above items (10), (11), (12), (13), (14) and (15), it is preferable that a surface material of the table has a film made of any material of iron, zirconia, alumina or zirconia or chromium, and titanium.

(17) In the bump forming apparatus according to the above item (14), it is preferable that a material boiling temperature of the flux, the solder paste or the conductive adhesive is higher than a melting point of the conductive particle by +10° C. to +40° C.

(18) In the bump forming apparatus according to any one of the above items (10), (11), (12), (13), (14), (15), (16) and (17), it is preferable that the conductive particles are collected subjecting the collected conductive particles to separation of the conductive particles and dust using a centrifuge in a centrifugal chamber.

DESCRIPTION OF EMBODIMENTS OF THE INVENTION

Embodiments of a bump forming apparatus and a bump forming method according to the present invention will be described hereunder, referring to FIG. 1 to FIG. 11.

Figure 1:
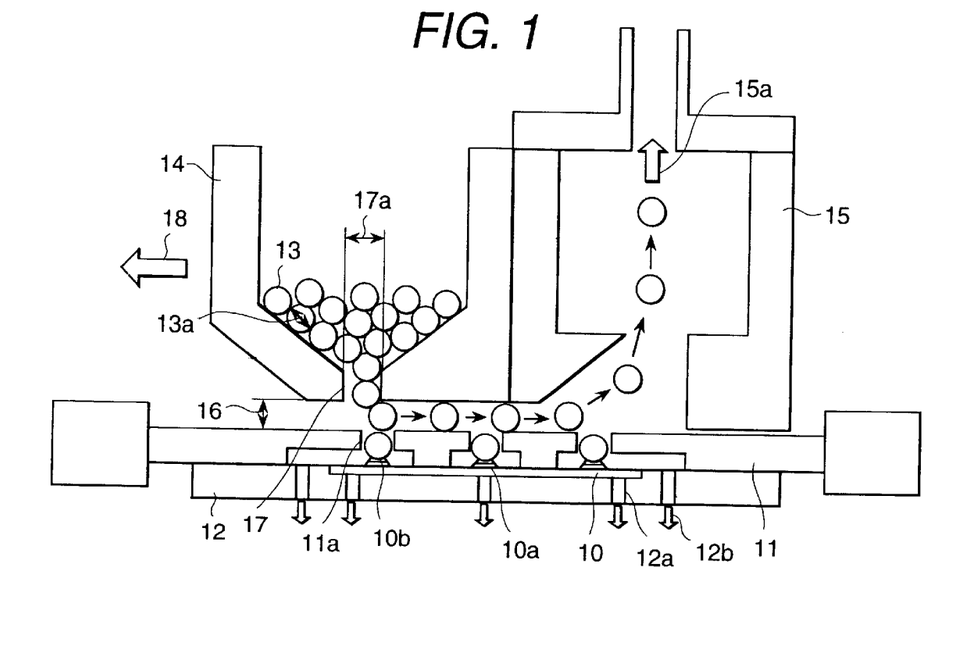
FIG. 1 is a cross-sectional view showing a main portion of an embodiment of a bump forming apparatus in accordance with the present invention.

FIG. 1 is a rough sectional view of a bump forming apparatus of an embodiment of the present invention.

A solder ball supply unit in this bump forming apparatus comprises a hopper 14 and a collecting unit 15 which construct a ball mounting head as a whole.

An object to be processed 10 is a semiconductor wafer which is held by a sucking force 12b produced in suction holes 12a of a table 12, and a mask 11 is closely attached to the object to be processed 10 by the sucking force 12b of the table 12 after positioning the positions of electrodes 10a of the object to be processed to the positions of mask through holes 11a of the ask 11.

A method of mounting solder balls 13 is that the ball mounting head is moved in a moving direction 18 of the mounting head while the solder balls 13 put into the hopper 14 are being dropped onto the mask 11 in a row from a slit 17 formed in the hopper 14.

While the solder balls dropped from the slit 17 are rolling on the mask 11 by a sucking force 15a of the collecting unit 15, the solder balls 13 are dropped into the through holes 11a of the mask 11 and fixed by an adhesive force of flux 10b printed onto the electrodes 10a on the object to be processed 10.

A slit width 17a of the slit 17 formed in the hopper 14 is formed in a dimension one to two times as large as a diameter 13a of the solder ball 13 so that the solder balls 13 may hardly choke the slit 17.

Further, a clearance 16 between the hopper 14 and the mask 11 is formed in a dimension one to two times as large as the diameter 13a of the solder ball 13 so that the solder balls 13 dropped onto the mask 11 may be not caught by the hopper 14.

On the other hand, all the excess solder balls 13 on the mask 11 are collected by the sucking force 15a of the collecting unit 15.

Figure 2A:
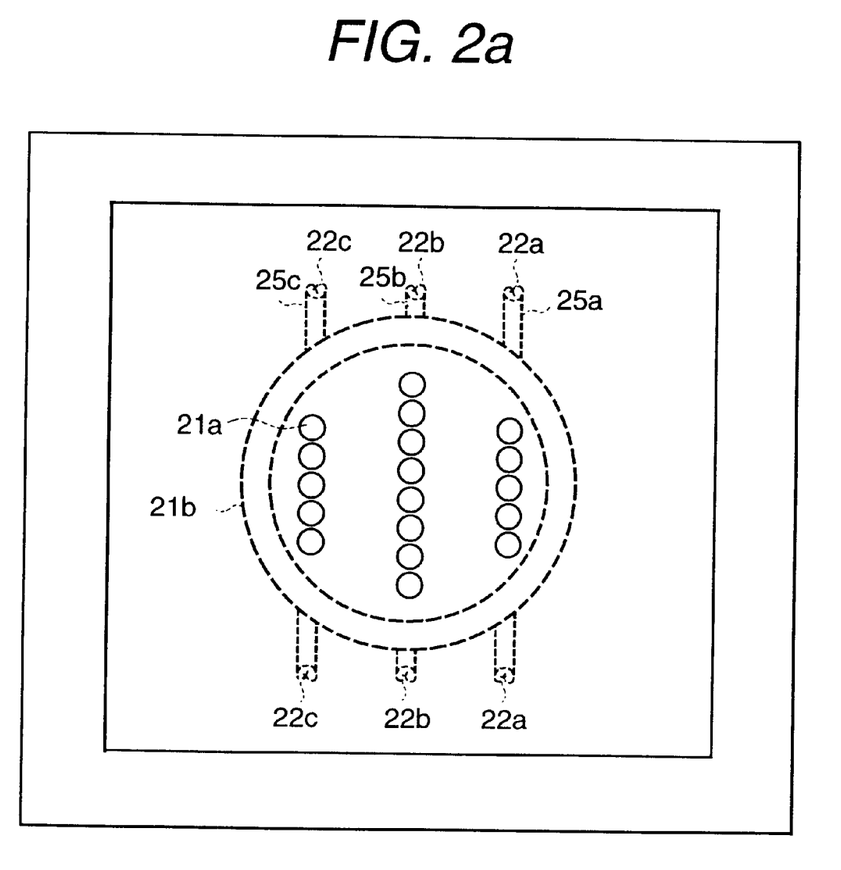
FIG. 2a is a plane view showing a main portion of a table in an embodiment of a bump forming apparatus in accordance with the present invention.
Figure 2B:
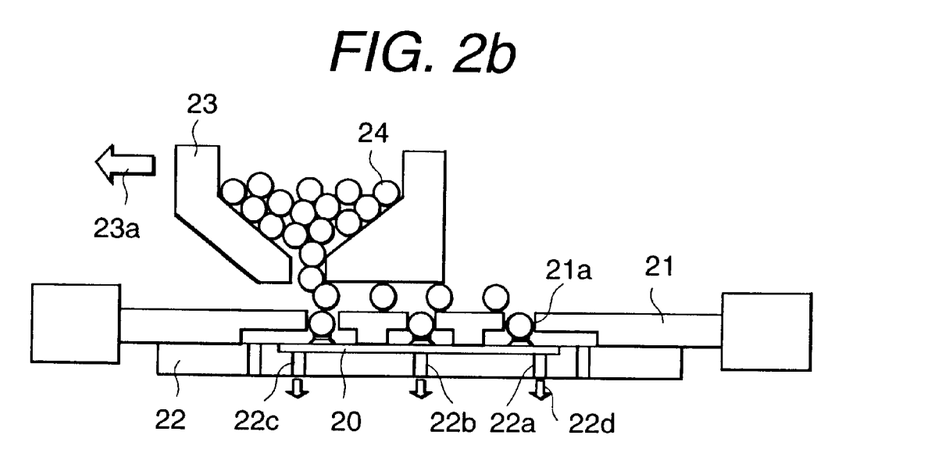
FIG. 2b is a sectional view showing a main portion of the bump forming apparatus in accordance with the present invention.

A table portion in the embodiment of the bump forming apparatus in accordance with the present invention will be described below.

FIGS. 2a and 2b show the table portion in the embodiment of the bump forming apparatus in accordance with the present invention.

Referring to FIGS. 2a and 2b, the table 22 (12) comprises suction holes 22a (12a), 22b, 22c. On the bottom surface of the mask 21 (11), there are provided a half-etching portion 21b engraved from the bottom surface side of the mask 21 (11), suction grooves 25a, 25b, 25c connected to the half-etching portion 21b, and the through holes 21a (11a).

The object to be processed 20 (10) is held to the table 22 (12), and the hopper 23 (14) is moved in the moving direction 23a (18) while the solder balls 24 (13) put into the hopper 23 (14) are being dropped down.

At that time, by producing the sucking force 22d (12b) only in the suction hole 22a (12a) when the hopper 23 (14) comes at the position of the suction hole 22a (12a), the solder ball 24 (13) are certainly dropped down by sucking the solder balls 24 (13) into the through holes 21a (11a) of the mask 21 through the suction groove 25a on the bottom surface side of the mask 21 (11).

As described above, the solder balls 24 (13) are dropped down into all the mask through holes 21a (11a) by sucking the solder balls 24 (13) through the suction grooves 25a, 25b, 25c of the mask 21 (11) by sequentially switching the suction holes A (22a), B (22b), C (22c) provided in the table 22 (12) in synchronism with the moving speed of the hopper 23 (14) in the moving direction 23a.

Figure 3:
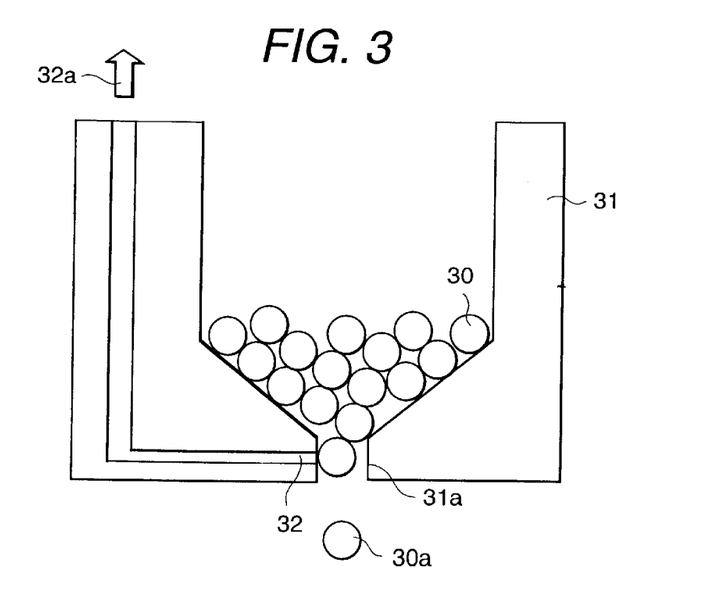
FIG. 3 is a cross-sectional view showing a main portion of a hopper in an embodiment of a bump forming apparatus in accordance with the present invention.

The hopper portion in the embodiment of the bump forming apparatus in accordance with the present invention will be described below.

FIG. 3 is a cross-sectional view showing the hopper portion in the embodiment of the bump forming apparatus in accordance with the present invention.

Referring to FIG. 3, a suction groove 32 is provided in the side wall surface portion of the slit portion 31a (17) of the hopper 31 (14) to hold the solder balls 30 (13) inside the hopper 31 by sucking a solder ball or solder balls 30 (13) in the hopper 31 by a sucking force 32a of the suction groove 32.

By releasing the solder balls 30 from the sucking force 32a, the solder balls 30 in the hopper 31 can be dropped down through the slit 31a to provide the dropped solder balls 30a.

As described above, by controlling the sucking force 32a of the hopper 31, dropping of the solder balls 30 can be controlled.

Figure 4:
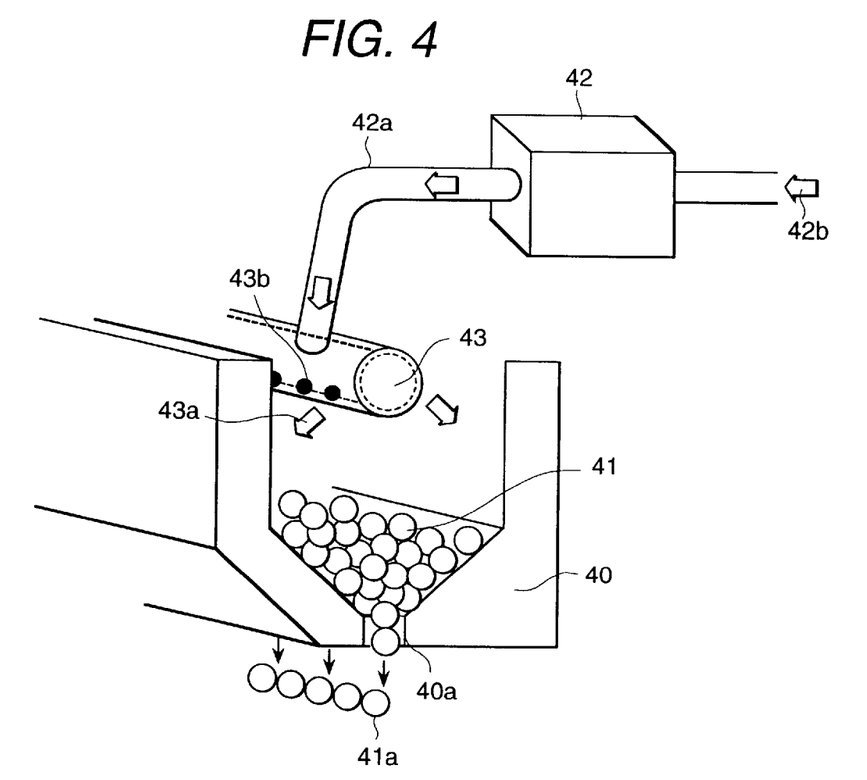
FIG. 4 is a view showing an example of a means for preventing solder balls from bonding together in a ball supply unit of an embodiment of a bump forming apparatus in accordance with the present invention.

Supply of the solder balls to the hopper portion in the embodiment of the bump forming apparatus in accordance with the present invention will be described below.

FIG. 4 is a view showing an example of a means for preventing the solder balls from bonding together in the ball supply unit of the embodiment of the bump forming apparatus in accordance with the present invention.

Referring to FIG. 4, the hopper 40 (14) is formed in such a construction that a fluid 42b such as air is made to flow into a charge neutralizer 42 to be converted into a charge neutralizing fluid 43a, and the charge neutralizing fluid 43a is blown against the solder balls 41 (13) inside the hopper 40 through open holes 43b of a pipe 43 via a flow passage 42a.

By neutralizing static electricity generated by friction between the solder ball 41 (13) and the hopper 40 (14) and between the solder balls 41 (13) each other, the solder balls 41 (13) can be dropped down in a row from the slit 40a (17) in the tip end portion of the hopper 40 (14) to provide the dropped solder balls 41a.

Figure 5:
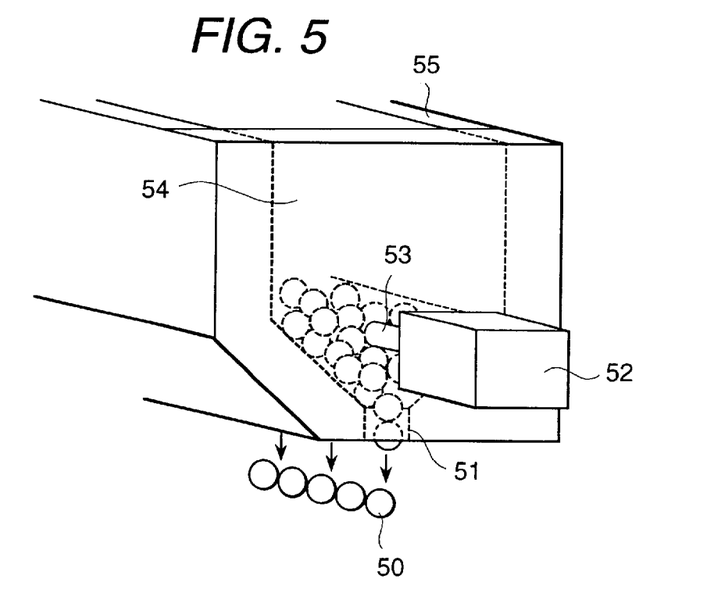
FIG. 5 is a view showing another example of a means for preventing solder balls from bonding together in a ball supply unit of an embodiment of a bump forming apparatus in accordance with the present invention.

Another example of the means for preventing the solder balls from bonding together in the ball supply unit of the embodiment of the bump forming apparatus in accordance with the present invention will be described below.

FIG. 5 is a view showing another example of the means for preventing the solder balls from bonding together in the ball supply unit of the embodiment of the bump forming apparatus in accordance with the present invention.

Referring to FIG. 5, this solder ball supply unit comprises a vibrator 52 for adding vibration to a side surface plate 54 of the hopper 55 (14). In order that the solder balls 50 closely attached to one another due to static electricity generated by friction between the solder balls 41 (13) and the hopper 40 (14) and between the solder balls 41 (13) each other are separated from one another, a shaft 53 of the vibrator 52 is hit against the side surface plate 54 of the hopper 55 (for example, once per second) to drop down the solder balls 50 (13) in a row from the slit 51 (17).

Figure 6:
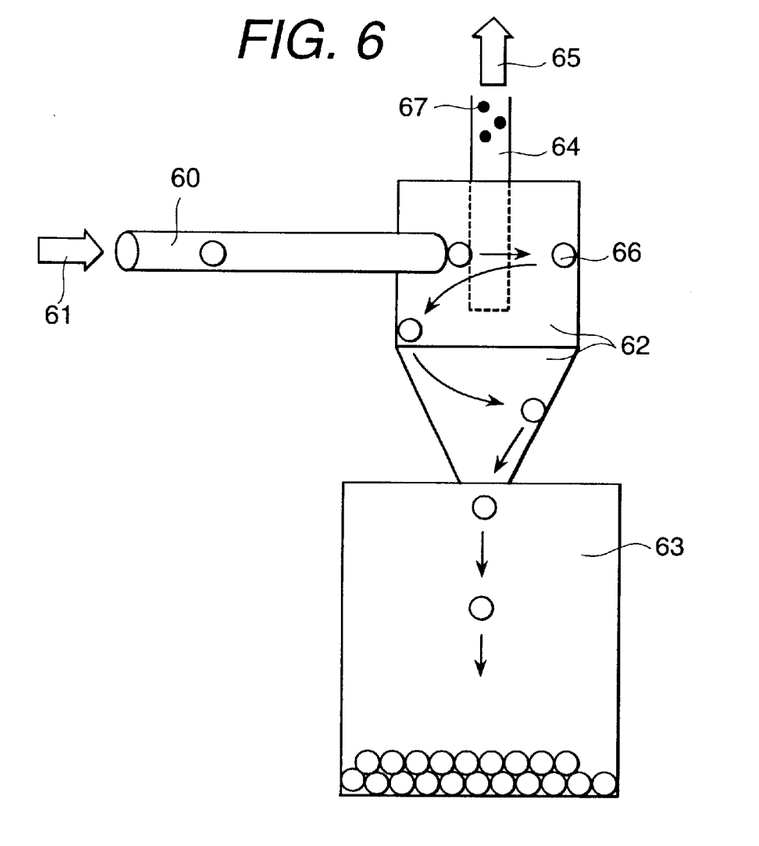
FIG. 6 is a cross-sectional view showing a main portion of a solder ball collecting portion of an embodiment of a bump forming apparatus in accordance with the present invention.

The ball collecting portion in the embodiment of the bump forming apparatus in accordance with the present invention will be described below.

FIG. 6 is a front view showing the solder ball collecting portion in the embodiment of the bump forming apparatus in accordance with the present invention.

Referring to FIG. 6, the solder ball collecting portion comprises a suction flow passage 60 for sucking the solder balls 66 (13), a centrifugal separation chamber 62, a collecting chamber 63, and an exhaust gas pipe 64.

The solder balls 66 (13) sucked by a sucking force 61 of the suction flow passage 60 are dropped down in the collecting chamber 63 placed at a lower position while the solder balls 66 (13) are swirling along the inner wall of the centrifugal separation chamber 62.

Then, by discharging an exhaust gas 65 through the exhaust gas pipe 64, dust 67 is separated from the solder balls 66 (13) to be discharged to the external together with fluid such as air.

Figure 7:
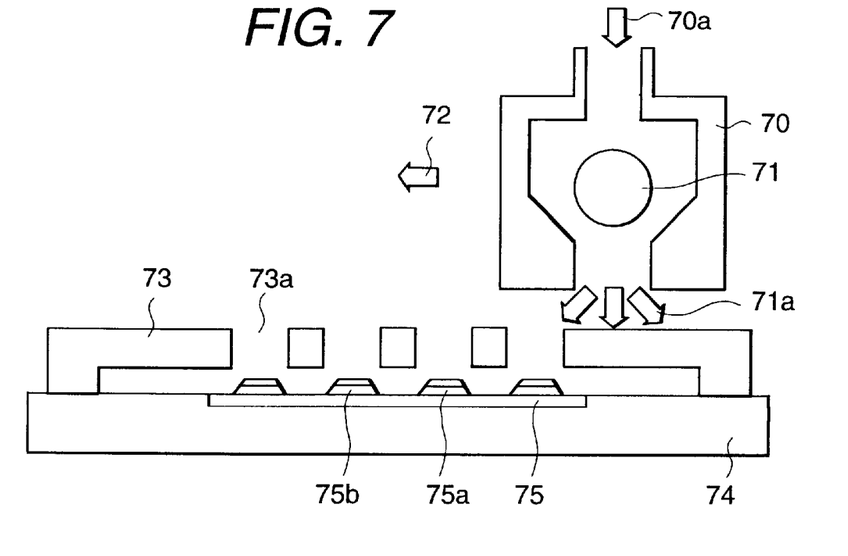
FIG. 7 is a cross-sectional view showing a main portion of a heater portion of an embodiment of a bump forming apparatus in accordance with the present invention.

A heater portion in the embodiment of the bump forming apparatus according to the present invention will be described below.

FIG. 7 is a front view showing the heater portion in the embodiment of the bump forming apparatus according to the present invention.

The object to be processed 75 (10) is held onto the table 74 (12), and the mask 73 (11) is closely fixed to the table 74 (12) after positioning the positions of the mask through holes 73a (11a) to the positions of the electrodes 75a of the object to be processed 75 (10).

A thermosetting flux is used as the flux on the object to be processed 75 (10), and a pressurized fluid 70a is made to flow to a heater 71 in a heating chamber 70, and the flux 75b on the electrode portions 75a of the object to be processed is softened by making the heated fluid 71a flow from the upper side of the mask 73 (11) through the through holes 73a so as to make the solder balls 13 closely attach to the electrode portions 75a.

Figure 8:
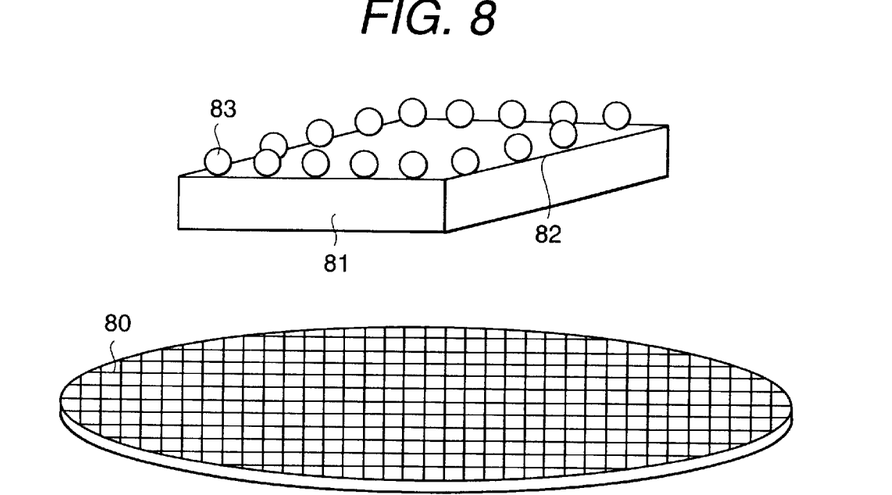
FIG. 8 is a view explaining an object to be processed using an embodiment of a bump forming apparatus in accordance with the present invention.

FIG. 8 is a view explaining an example of an object to be processed.

Referring to FIG. 8, in a case where the object to be processed is, for example, an Si wafer 80, circuits are formed on the Si wafer 80, and the electrode portions 82 are arranged thereon.

The electrode portions 82 are plated with tin or the like, and solder bumps 83 are formed on the electrode portions 82.

Recently, flip chips having solder bumps 83 of a diameter below 300 µm and a pitch between bumps below 500 µm are gradually widely used.

Since the number of bumps formed on the Si wafer 80 is several ten thousands to several hundred thousands, a technology capable of mounting solder balls of the number on the Si wafer 80 in a state of wafer at a time is required.

Figure 9:
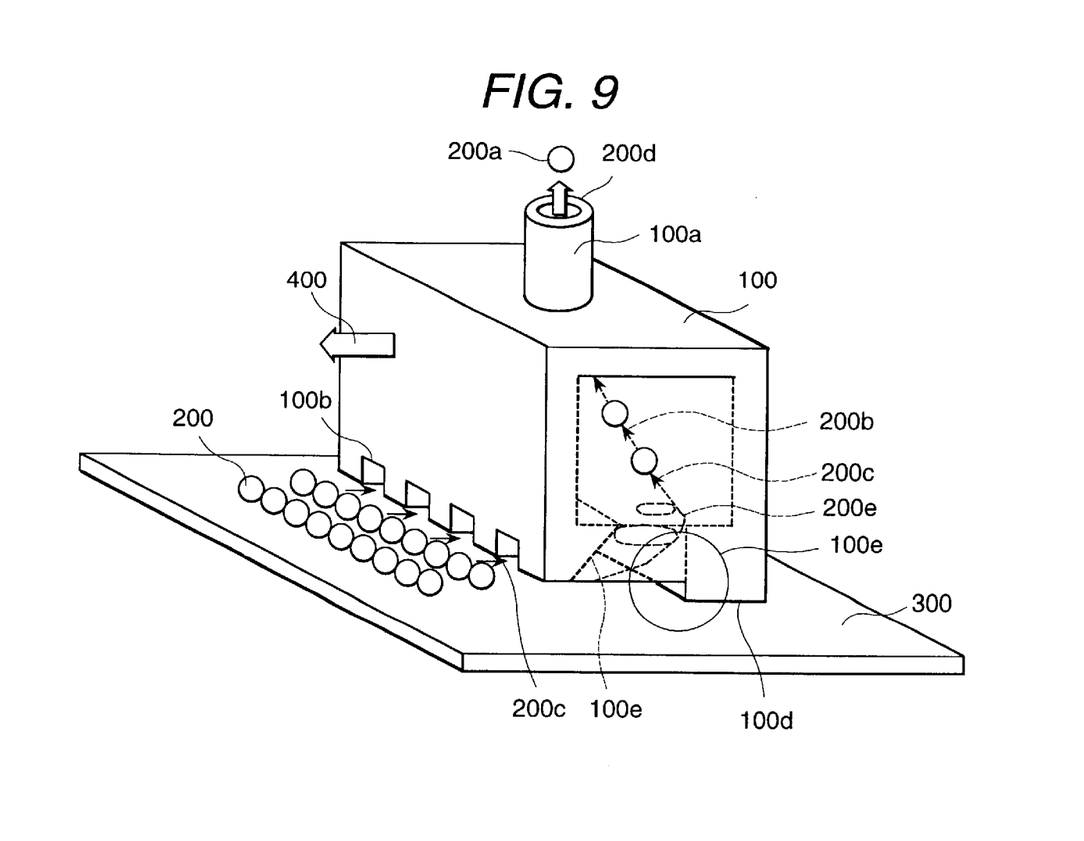
FIG. 9 is a view explaining a solder ball collecting portion of an embodiment of a bump forming apparatus in accordance with the present invention.

The ball collecting portion in the embodiment of the bump forming apparatus in accordance with the present invention will be described below.

FIG. 9 is a view showing the solder ball collecting portion described above.

The solder ball collecting portion comprises a collecting unit 100 and a collecting pipe 100a. The collecting unit 100 is constructed so as to move in the moving direction of the collecting unit 100 in order to collect the solder balls 200 (13) dropped on the solder mask 300.

The dropped solder balls 200 (13) are sucked toward the sucking direction 200c of the collecting unit 100 by the sucking force 200d. The sucked solder balls 200b pass through the collecting pipe 100a to be collected, and become the collected solder balls 200a.

In the solder ball collecting portion, in order to improve the sucking force 200d of the solder balls 200 (13), the inlet of the suction portion 100b is formed in a projecting-and-depressing shape to make the cross-sectional area of the inlet of the suction portion 100b large.

All the solder balls 200 (13) on the solder mask 300 (11) are collected by turbulent flow 200e inside the collecting unit 100 and the sucking force 200d without remaining in the rear portion of the suction portion 100c.

In order to generate the turbulent flow 200e, a gap is provided between the solder mask 300 (11) and the bottom surface of the sucking portion of the collecting unit 100, and the inlet of the suction portion 100b is formed in the projecting and-depressing shape, and the edge portion of the suction portion 100c is formed in a tapered shape.

Figure 10:
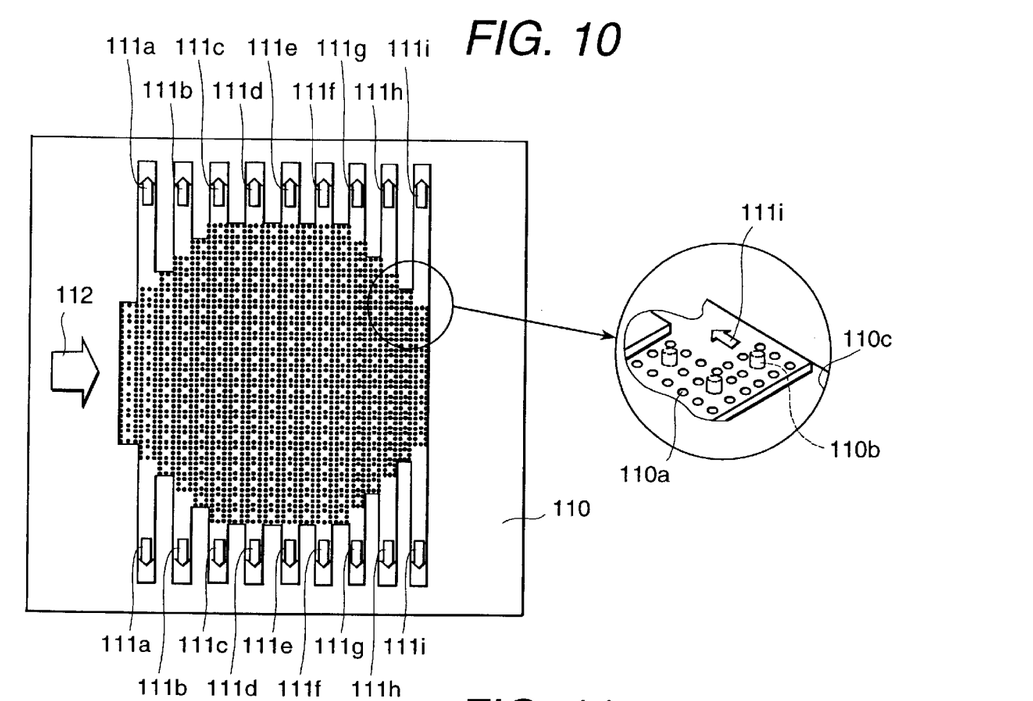
FIG. 10 is a front view showing a mask of an embodiment of a bump forming apparatus in accordance with the present invention.

The mask in the embodiment of the bump forming apparatus in accordance with the present invention will be described below.

FIG. 10 is a front view showing the mask in the embodiment of the bump forming apparatus in accordance with the present invention.

Referring to FIG. 10, the mask 110 (11) has the through holes 110a, the stoppers 110b, the half-etching portions 110c, and the suction grooves 111a to 111i.

Further, the mask 110 (11) is constructed so that the sucking can be sequentially switched in order of the suction grooves 111a to 111i in synchronism with the moving speed of the process direction 112 of dropping of the solder balls.

Furthermore, the through holes 110a of the mask 110 (11) are constructed so that the solder balls on the mask 110 can be dropped down through the suction grooves 111a to 111i.

Figure 11:
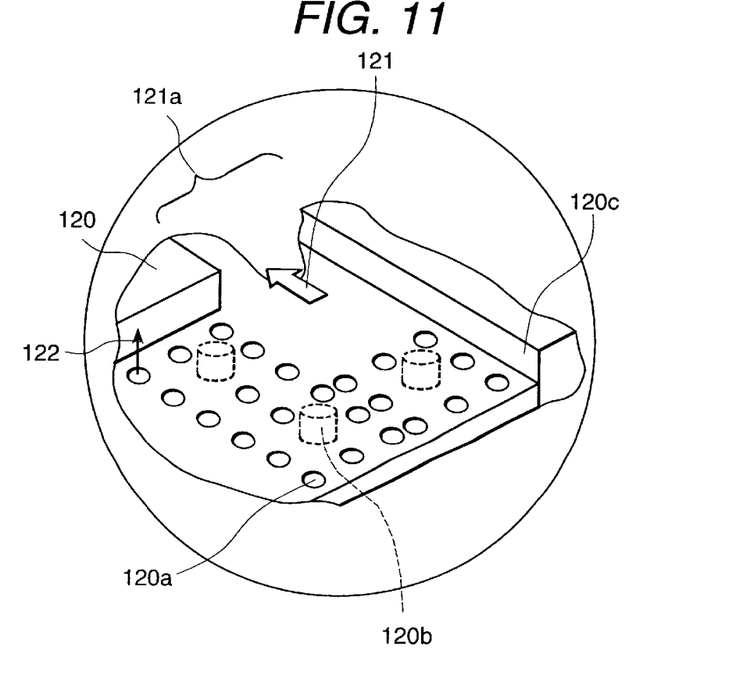
FIG. 11 is a view explaining a reverse surface of the embodiment of the bump forming apparatus in accordance with the present invention.

The bottom surface of the mask in the embodiment of the bump forming apparatus in accordance with the present invention will be described below.

FIG. 11 is a view showing the bottom surface of the mask described above.

Referring to FIG. 11, the mask 120 has the through holes 120a, the stoppers 120b, the half-etching portions 120c, and the suction grooves 121a.

The through holes 120a of the mask 120 are constructed so that the solder balls can be dropped into the through holes 120a by the sucking force from the suction grooves 121a.

Figure 12:
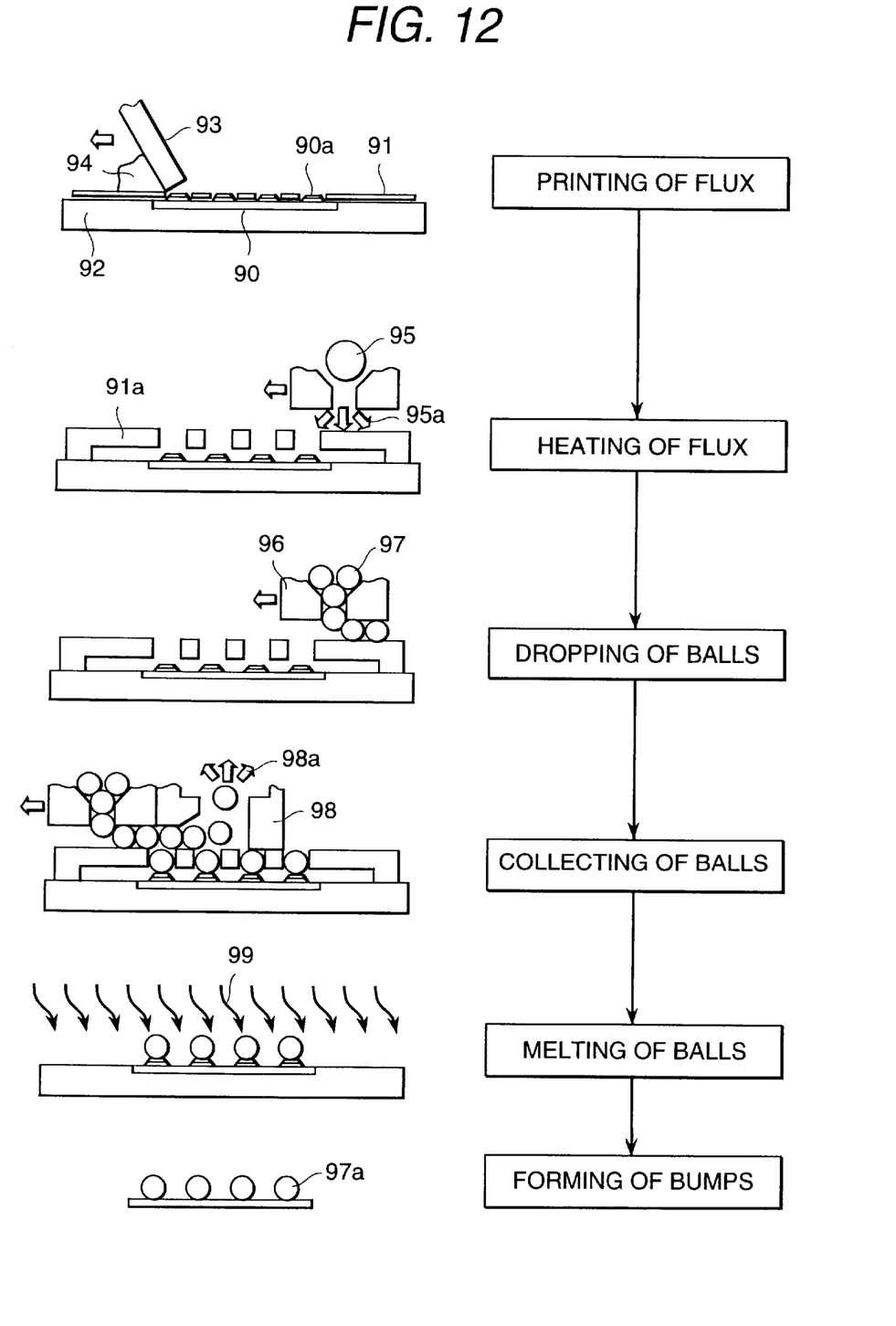
FIG. 12 is a view explaining an embodiment of a bump forming method in accordance with the present invention.

An embodiment of a bump forming method in accordance with the present invention will be described below.

FIG. 12 is a view showing the embodiment of the bump forming method in accordance with the present invention.

Referring to FIG. 12, the object to be processed 90 (10) is held to the table 92 (12), and the mask 91 is closely attached to the table 92 (12) by the sucking force 12b after positioning the positions of the electrodes 90a (10a) of the object to be processed 90 (10) to the positions of the mask through holes of the mask 91. After that, the flux 94 is printed on the electrodes 90a (10a) of the object to be processed 90 (10) by moving the squeegee 93.

After that, the mask 91a is closely attached to the table 92 by the sucking force after positioning the positions of the electrodes 90a (10a) of the object to be processed 90 (10) to the positions of the mask through holes of the mask 91a, and then the flux on the electrodes 90a is heated by the heated fluid 95a from the heater 95.

After that, the hopper 96 (14) is moved while the solder balls 97 (13) put in the hopper 96 (14) are being dropped down to drop the solder balls 97 (13) into the through holes of the mask 91a.

After that, the solder balls 97 not existing in the through holes of the mask 91a are collected by the sucking force 98a of the solder ball collecting portion 98.

After that, the solder balls 97 on the electrodes 90a of the object to be processed 90 are melted by heating the object to be processed 90 with hot wind 99 to form the solder bumps 97a.

Figure 13:
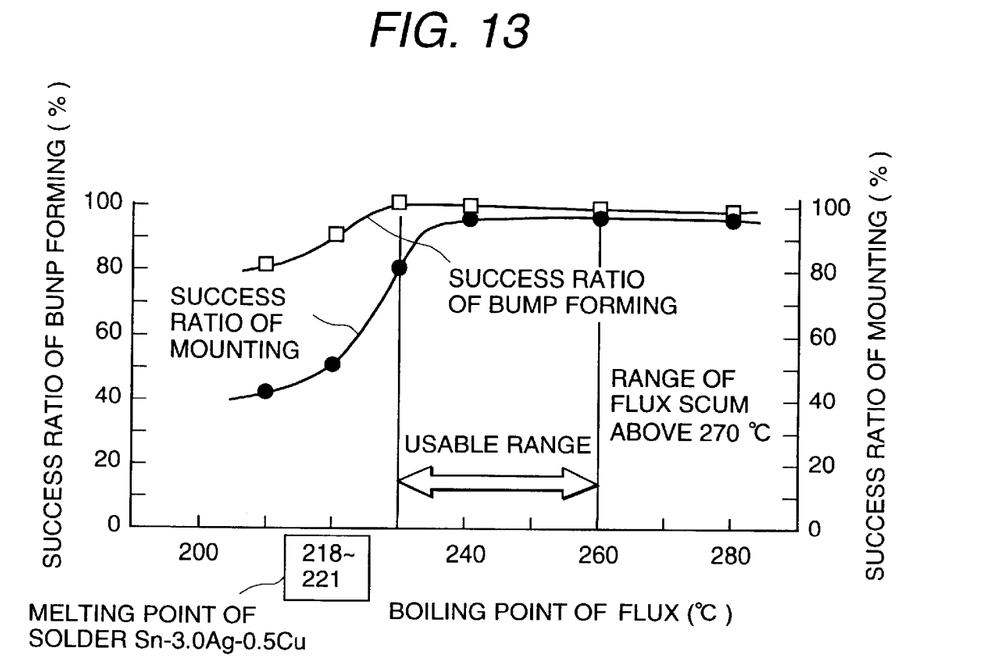
FIG. 13 is a graph showing boiling point of flux, success ratio of mounting solder balls and success ratio of forming bumps in a case of using the embodiment of the bump forming apparatus and the embodiment of the bump forming method in accordance with the present invention.

FIG. 13 is a graph showing boiling points of the flux, success ratio of mounting solder balls and success ratio of forming bumps in a case of using the embodiment of the bump forming apparatus and the embodiment of the bump forming method in accordance with the present invention.

In the case where the flux is applied to the electrode portions on the wafer and then the solder balls are mounted on the electrode portions of the wafer, the success ratio of mounting solder balls is decreased as the boiling point of the flux is lower because the solder balls are moved together with the flux due to occurrence of running of the flux.

For example, in a case where the bumps are formed using solder balls made of a material of Sn-3.0 Ag-0.5 Cu, the success ratio of forming bumps is good and becomes 90% or higher when a flux having a boiling point higher than a melting point of the solder ball by +10° C. is used.

This is because the flux boils to cause displacement of the solder balls due to the force of the boiling before the solder balls mounted on the electrode portions of the wafer are melted to form the bumps.

The displacement of the solder balls becomes harder to occur as the boiling point of the flux becomes higher. However, when the boiling temperature of the flux is higher than 270° C., scum of the flux remains because the scum of the flux can not be completely cleaned up using a cleaning solution after forming the bumps.

Therefore, in the case of bonding the solder balls made of the material of Sn-3.0 Ag-0.5 Cu, the optimum range of the boiling point of the flux is +10° C. to +40° C. above the melting point of the solder ball.

As described above, the embodiment of the bump forming apparatus in accordance with the present invention comprises:

the mask 11 having the plurality of holes 110a having a diameter larger than the diameter of conductive particles at positions corresponding to the positions of the plurality of electrode portions 10a to mount thereon the conductive particles (the solder balls) 13, the plurality of electrode portions 10a being formed on one surface of the object to be processed (the semiconductor wafer or the electronic circuit board) 10, the mask 11 being positioned so that the plurality of holes 110a may be individually opposite to the plurality of electrode portions 10a formed on the object to be processed;

the table 12 having the plurality of holes 12a for sucking the object to be processed 10 from the other surface of the object to be processed 10 and for sucking the conductive particles 13 through the plurality of holes 110a formed in the mask 11 so that the conductive particles 13 may be mounted on the electrode portions 10a formed on the object to be processed 10;

the hopper 14 containing the plurality of conductive particles 13, and preventing the plurality of conductive particles 13 from adhering to each other, and having the slit portion 17 for dropping the plurality of conductive particles 13 by the self-weight; and the collecting unit 15 for collecting the conductive particles 13, wherein the slit portion 17 formed in the hopper 14 is moved, facing the upper surface of the mask 11 with a gap between the slit portion 17 and the upper surface of the mask 11 larger than the diameter of the conductive particle 13, the hopper 14 being arranged in the preceding side in the moving direction, the collecting unit 15 being arranged in the following side, the hopper 14 and the collecting unit 15 being moved along the upper surface of the mask 11, the conductive particles 13 not dropped into the holes 110a of the mask being collected by the collecting unit 15.

Therefore, it is possible to provide the economical bump forming apparatus by which the bumps can be formed on the electrode portions of a wafer or a circuit board using the spherical conductive particles having a given dimensional accuracy in order to make the deviations of bump height and volume of the conductive particles having a diameter smaller than 300 $\mu$m.

Further, it is possible to provide the bump forming apparatus recyclable of the conductive particles by certainly and easily sucking and collecting the excess conductive particles remaining on the mask to reuse the expensive conductive particles.

Further, since the suction groove 32 for sucking and fixing the conductive particles 13 so as to not drop down is formed in the side wall portion of the slit portion 17 of the hopper 14, it is possible to prevent the conductive particles 13 from dropping down at a timing when the conductive particles 13 should not be dropped down.

Thereby, number of the conductive particles to be collected can be reduced.

Although the description has been made separately on the method of FIG. 4 and on the method of FIG. 5 as the means for preventing the conductive particles 13 from adhering to each other, it is possible to preventing the conductive particles 13 from adhering to each other using both of the method of FIG. 4 and the method of FIG. 5.

Further, the surface of the table may be constructed so as to have a film made of a material selected from the group consisting of iron, zirconia, alumina, zirconia, chromium and titanium.

Further, the bump forming apparatus may be constructed so as to have a humidity control mechanism for maintaining the humidity inside the bump forming apparatus within the range of 40 to 60%.

According to the present invention, it is possible to provide the economical bump forming method and the economical bump forming apparatus by which the bumps can be formed on the electrode portions of a wafer or a circuit board using the spherical conductive particles having a given dimensional accuracy in order to make the deviations of bump height and volume of conductive particles.

Further, it is possible to provide the bump forming method and the bump forming apparatus recyclable of the conductive particles by certainly and easily sucking and collecting the excess conductive particles remaining on the mask to reuse the expensive conductive particles.

Further, the productivity of bump forming can be substantially improved because the conductive particles can be mounted on the electrode portions of a wafer or a circuit board at a time and because the success ratio of mounting the conductive particles is high and the cost of apparatus is economical.

What is claimed is:

1. A bump forming method of forming bumps on electrode portions of a semiconductor wafer or an electronic circuit board using conductive particles, the method comprising:

a process of positioning a mask having through holes for the conductive particles at bump forming positions to the wafer or the circuit board, and putting the mask and the wafer or the circuit board on a table having suction holes formed thereon;

a particle mounting process of moving a conductive particle supply means while the conductive particles are being dropped on the mask, and sucking the conductive particles through the holes formed on the table via the through holes formed in the mask in synchronism with a moving position of the conductive particle supply means, and mounting the conductive particles onto the electrode portions of the semiconductor wafer or the electronic circuit board; and a ball collecting process of collecting the conductive particles not dropped into the through holes of the mask.

2. A bump forming method according to claim 1, wherein a groove for sucking the conductive particles is formed in a tip end portion of the conductive particle supply means, and the conductive particle supply means controls holding and dropping of the conductive particle by controlling sucking and not-sucking of the conductive particle using the sucking groove.

3. A bump forming method according to claim 1, wherein a charge neutralizing fluid is blown to the conductive particles contained in the supply means.

4. A bump forming method according to claim 1, wherein a vibrator is arranged on a side surface of a conductive particle containing portion of the supply means, and the conductive particles are dropped down from the supply means while vibration is being added to the conductive particles.

5. A bump forming method according to claim 1, wherein flux or solder paste or conductive adhesive is attached onto the electrode portions on the semiconductor wafer or the circuit board in advance, and then heat is supplied from an upper side of the thorough holes of the mask after dropping the conductive particles to increase a sticking force between the electrode portion and the conductive particle.

6. A bump forming method according to claim 1, wherein the conductive particles not dropped into the through holes of the mask are collected by a particle collecting means, the particle collecting means comprises an suction portion for sucking the conductive particles, and many slit grooves are formed in an inlet port of the suction portion to collect the conductive particles by producing a turbulent flow in the suction portion.

7. A bump forming method according to claim 1, wherein a surface of the table is constructed so as to have a film made of any material of iron, zirconia, alumina or zirconia or chromium, and titanium.

8. A bump forming method according to claim 5, wherein a material boiling temperature of the flux, the solder paste or the conductive adhesive is higher than a melting point of the conductive particle by +10° C. to +40° C.

9. A bump forming method according to claim 1, wherein the conductive particles are collected, subjecting the collected conductive particles to separation of the conductive particles and dust using a centrifuge in a centrifugal chamber.

* * * * *